(12) United States Patent
Duensing et al.

(10) Patent No.: US 10,598,744 B2
(45) Date of Patent: Mar. 24, 2020

(54) WIRELESS-TYPE RF COIL AND TRANSMITTER FOR LEGACY MAGNETIC RESONANCE IMAGING (MRI) SYSTEMS AND METHOD OF OPERATION THEREOF

(71) Applicant: KONINKLIJKE PHILIPS N.V., Eindhoven (NL)

(72) Inventors: George Randall Duensing, Eindhoven (NL); Arne Reykowski, Eindhoven (NL); Timothy Ortiz, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 103 days.

(21) Appl. No.: 15/561,536

(22) PCT Filed: Mar. 14, 2016

(86) PCT No.: PCT/IB2016/051437
§ 371 (c)(1),
(2) Date: Sep. 26, 2017

(87) PCT Pub. No.: WO2016/157009
PCT Pub. Date: Oct. 6, 2016

(65) Prior Publication Data
US 2018/0081009 A1    Mar. 22, 2018

Related U.S. Application Data

(60) Provisional application No. 62/140,866, filed on Mar. 31, 2015.

(51) Int. Cl.
*G01R 33/36*    (2006.01)

(52) U.S. Cl.
CPC ..... *G01R 33/3692* (2013.01); *G01R 33/3621* (2013.01)

(58) Field of Classification Search
CPC .................. G01R 33/3692; G01R 33/3621
See application file for complete search history.

(56) References Cited

U.S. PATENT DOCUMENTS

| | | |
|---|---|---|
| 5,023,552 A | 6/1991 | Mehlkopf et al. |
| 5,245,288 A | 9/1993 | Leussler |
| 5,384,536 A * | 1/1995 | Murakami ............. G01R 33/28 324/309 |
| 5,491,415 A | 2/1996 | Holmes et al. |
| | (Continued) | |

*Primary Examiner* — G. M. A Hyder

(57) ABSTRACT

A transmission apparatus for legacy magnetic resonance (MR) systems including one or more of a radio transmission portion having coupling to an analog RF cable port of the MR system including at least one first controller, an analog-to-digital converter (A/D), and a transmitter. The first controller controls the A/D to digitize analog magnetic resonance (MR) information received from the RF coil and controls the transmitter to transmit the digitized MR information. A radio reception portion including an analog output port and a coupler for coupling the output port to a legacy cable port input of the legacy system including at least one second controller, a receiver, and a digital-to-analog converter (D/A). The second controller controls the receiver to receive the transmitted digitized MR information, and controls the D/A to perform a digital-to-analog conversion to form a corresponding analog MR signal which is output at the output port.

15 Claims, 6 Drawing Sheets

(56) References Cited

U.S. PATENT DOCUMENTS

| | | |
|---|---|---|
| 6,977,502 B1 | 12/2005 | Hertz |
| 7,777,490 B2 | 8/2010 | Haans et al. |
| 2003/0078004 A1 | 4/2003 | Vester |
| 2006/0244452 A1 | 11/2006 | Den Boef |
| 2009/0322335 A1* | 12/2009 | Adachi .............. G01R 33/3692 324/318 |
| 2010/0117649 A1* | 5/2010 | Nakanishi .......... G01R 33/3692 324/318 |
| 2011/0227574 A1* | 9/2011 | Akita ................ G01R 33/3692 324/322 |
| 2013/0241547 A1 | 9/2013 | Biber et al. |

* cited by examiner

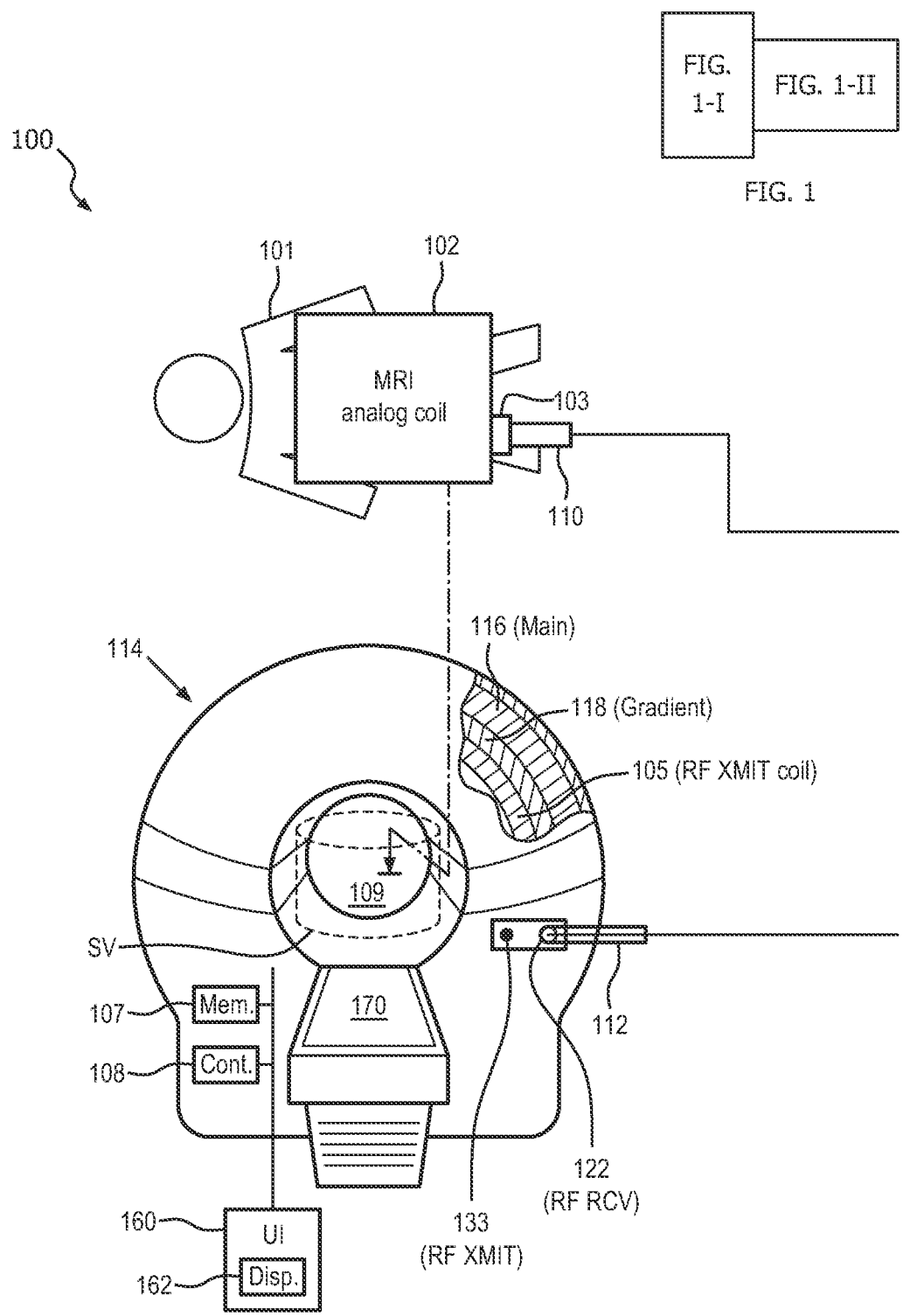
FIG. 1-I

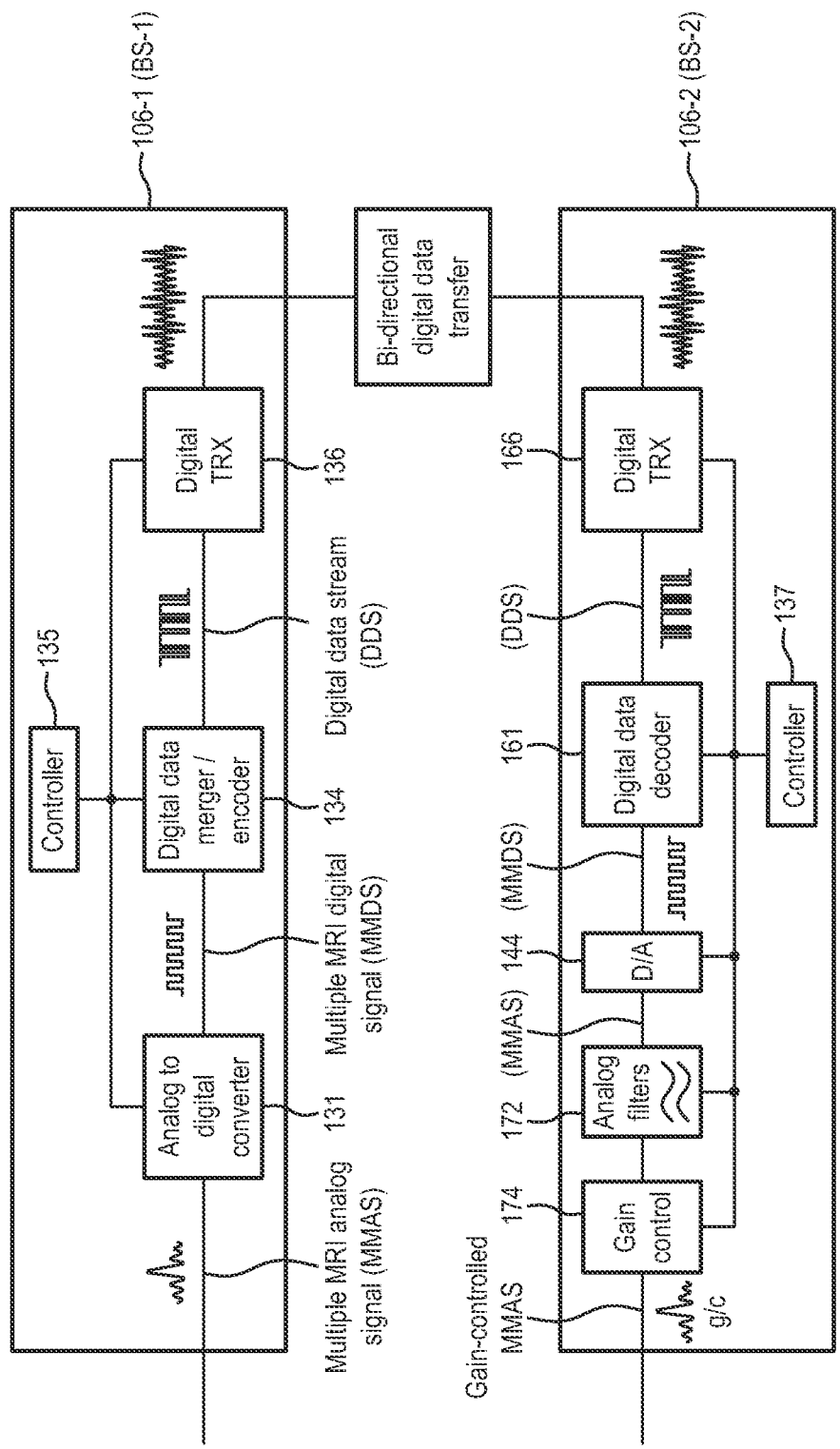
FIG. 1-II

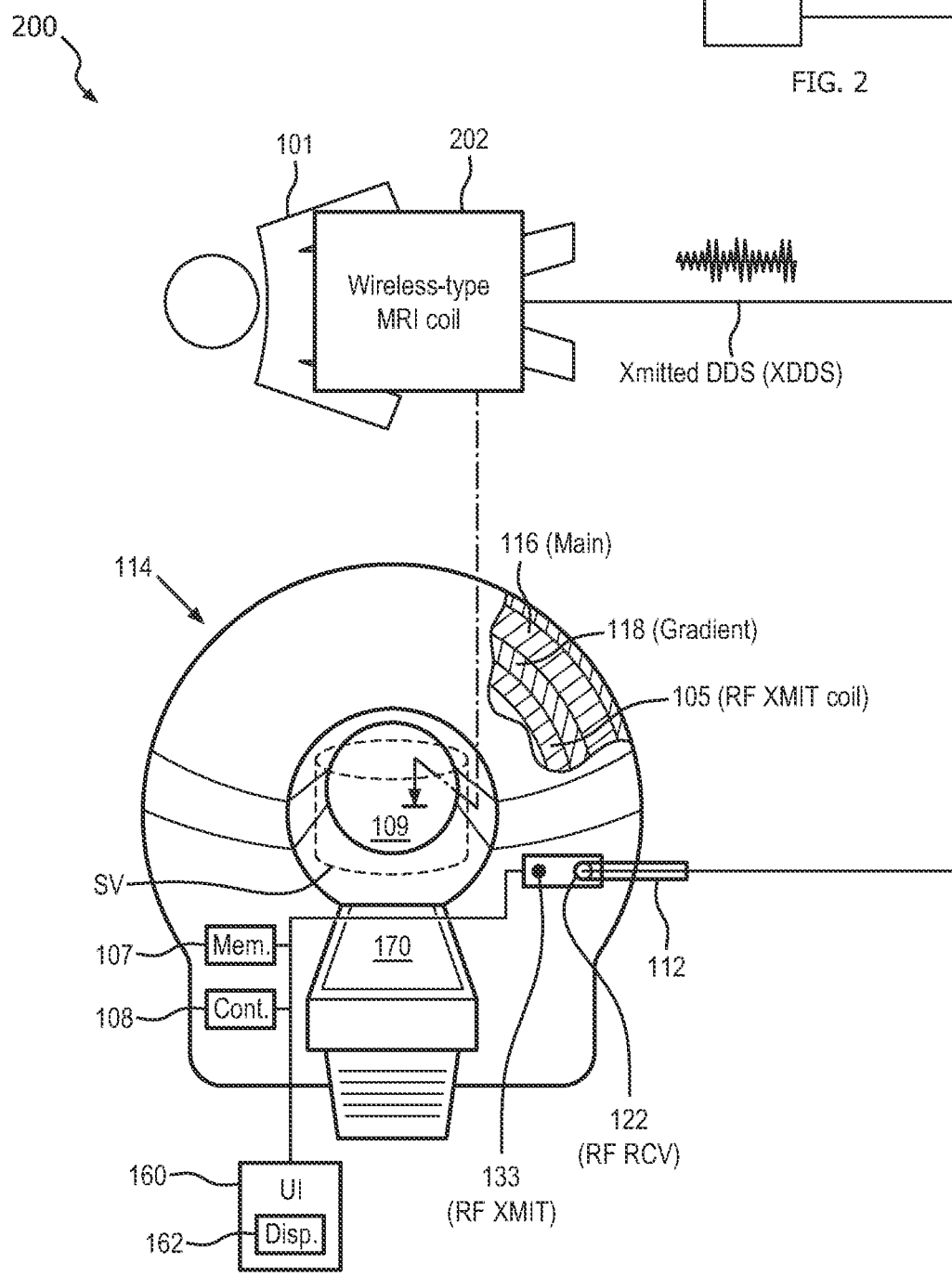
FIG. 2-I

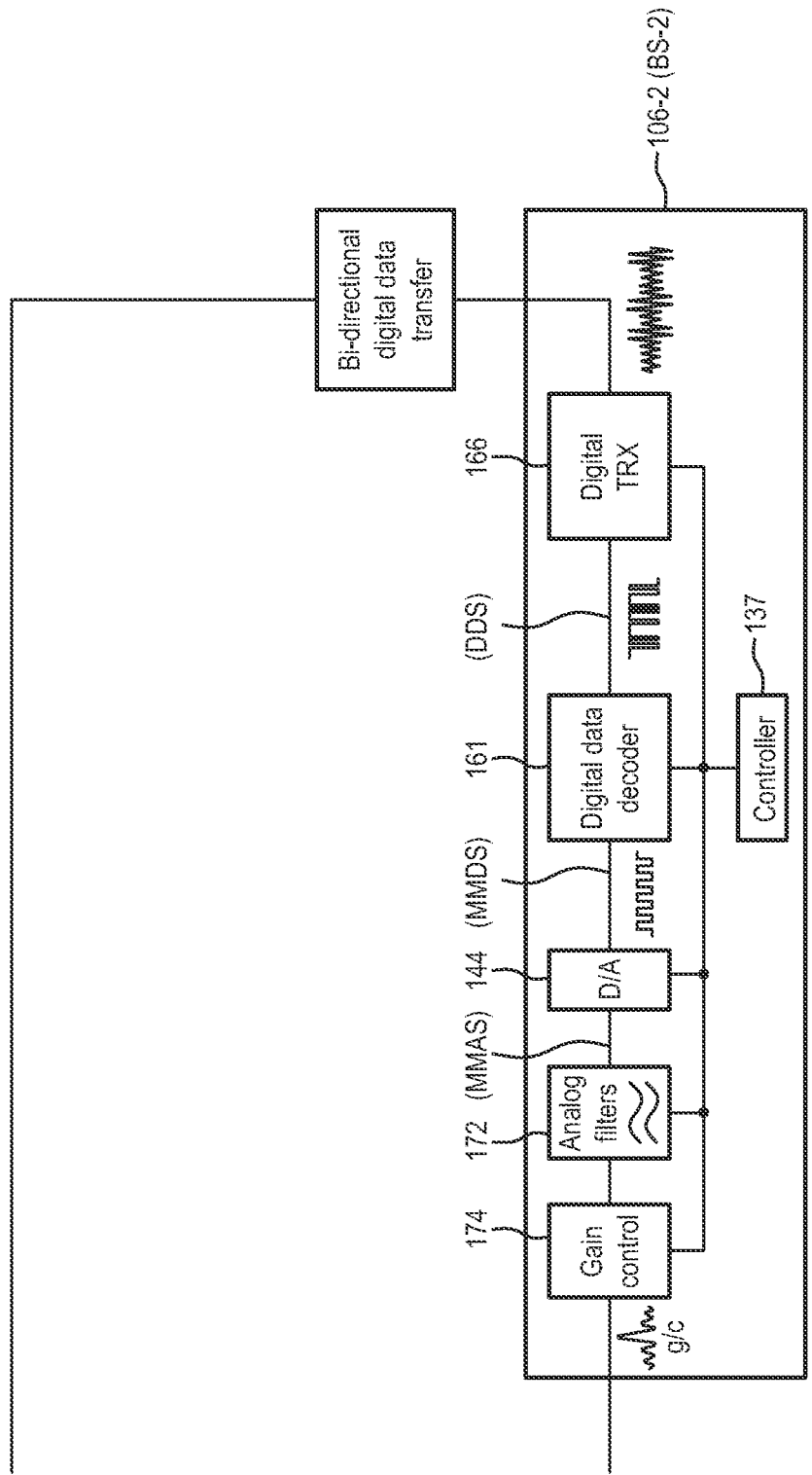
FIG. 2-II

WIRELESS-TYPE RF COIL AND TRANSMITTER FOR LEGACY MAGNETIC RESONANCE IMAGING (MRI) SYSTEMS AND METHOD OF OPERATION THEREOF

CROSS REFERENCE TO RELATED APPLICATIONS

This application is a U.S. national phase application of International Application No. PCT/IB2016/051437, filed on Mar. 14, 2016, which claims the benefit of U.S. provisional Application Ser. No. 62/140,866 filed on Mar. 31, 2015 and is incorporated herein by reference.

The present system relates to a wireless system for use in legacy magnetic resonance (MR) imaging (MRI) and spectroscopy (MRS) systems and, more particularly, to a wireless replacement reception system for analog-type MRI and MRS systems coils and a method of operation thereof.

Typical analog MRI systems include radiofrequency (RF) coils which may receive magnetic resonance signals emitted by an object-of-interest (OOI) being scanned. In conventional analog-type RF coils, the received magnetic resonance signals are amplified by the RF coils and thereafter transmitted as analog information via galvanic cables such as RF cables to a controller of the system for further processing such as for reconstruction to form an image (e.g., an MRI image) and/or a spectrograph. The analog-type RF cables may be coupled at the coil and at the controller of the system using analog-type RF ports. Unfortunately, conventional RF cables may emit radiation which may expose a patient being scanned to high local SAR levels and may also degrade the received magnetic resonance signals especially over long cable runs. While this may be counter acted by using what is known as "BALUNs" which may reduce RF shield currents on the cables. However, these BALUNs are expensive, need to be tuned, and there is no simple way of monitoring their proper function or operation. All of the above problems with BALUNS translates to higher cost for ensuring patient safety.

Moreover, because of the analog nature of the legacy-type MRI coils and the fact that they are embedded physically in the systems, it is difficult if not impossible to update these systems to use new coils, such as analog or digital wireless coils including ones formed for particular given applications. Accordingly, embodiments of the present system may overcome these and/or other disadvantages of prior art systems.

The system(s), device(s), method(s), arrangements(s), user interface(s), computer program(s), processes, etc. (hereinafter each of which will be referred to as system, unless the context indicates otherwise), described herein address problems in prior art systems.

In accordance with embodiments of the present system, there is disclosed a transmission apparatus for a legacy magnetic resonance (MR) system. The apparatus may include one or more of a radio transmission portion having a coupler for coupling to an analog RF cable port of an RF coil of the MR system. The radio transmission portion may include at least one first controller, an analog-to-digital converter (A/D), and a transmitter (Tx). The first controller may be configured (e.g., programmed from a preprogrammed state and/or otherwise structured) to control the A/D to digitize analog magnetic resonance (MR) information received from the RF coil and to control the Tx to transmit the digitized MR information. A radio reception portion may include an analog output port and a coupler for coupling the output port to a legacy RF cable port input of the legacy MR system. The radio reception portion may include at least one second controller, a receiver (Rx), and a digital-to-analog converter (D/A). The second controller may be operative to control the receiver (Rx) to receive the transmitted digitized MR information, and control the D/A to perform a digital-to-analog conversion upon received digitized MR information to form a corresponding analog MR signal which is output at the output port.

The radio reception portion may include a gain controller operative to control the gain of the analog MR signal prior to the output. The gain controller may determine an average of the analog MR signal, and compare this average to a threshold desired gain control threshold (GCT) value. The gain controller may adjust the gain of the analog MR signal based upon results of the comparison. The transmission apparatus may include at least one of a wireless or optical transmitter, to perform the transmission of the digitized MR information. The transmission radio reception portion may include analog filters which filter the analog MR signal prior to the gain control.

In accordance with embodiments, a transmission apparatus for a legacy magnetic resonance (MR) system may be provided including a transmit-type RF coil comprising a plurality of receive-loops for receiving induced MR signals from an object-of-interest (OOI) subject to MR sequence signals, and at least one first controller. The at least one controller may be configured to form MR information based upon the received induced MR signals, digitize the MR information, and to transmit the MR information as a digital data stream signal. A radio reception portion may be provided having an analog output port and a coupler for coupling the output port to a legacy RF cable port input of the legacy MR system. The radio reception portion may include at least one second controller, a receiver (Rx), and a digital-to-analog converter (D/A). The second controller may be operative to control the receiver (Rx) to receive the transmitted digitized MR information, and control the D/A to perform a digital-to-analog conversion upon received digitized MR information to form a corresponding analog MR signal which is output at the output port.

In accordance with embodiments of the present system, there is disclosed a method for upgrading a legacy MR system, the method comprising acts of: coupling to an analog RF cable port of an RF coil; performing an analog-to-digital conversion to digitize analog magnetic resonance (MR) information received from the RF coil; transmitting wirelessly the digitized MR information; receiving the wirelessly transmitted digitized MR information; performing a digital-to-analog conversion upon the received digitized MR information to form a corresponding analog MR signal; outputting the corresponding analog MR signal to an output port; and coupling the output port to a legacy RF cable port input of the legacy MR system. The method may include one or more of controlling the gain of the analog MR signal prior to the output port, determining an average of the analog MR signal, and comparing the average to a threshold desired gain control threshold (GCT) value, adjusting the gain of the analog MR signal based upon results of the comparison and filtering the analog MR signal prior to the gain control.

The present invention is explained in further detail in the following exemplary embodiments and with reference to the figures, where identical or similar elements may be partly indicated by the same or similar reference numerals, and the features of various exemplary embodiments being combinable. In the drawings:

FIG. 1 shows an exploded partially cutaway schematic block diagram of a portion of an MR system in accordance with embodiments of the present system;

FIG. 2 shows an exploded partially cutaway schematic block diagram of portion of an MR system in accordance with embodiments of the present system.

Figure 3:
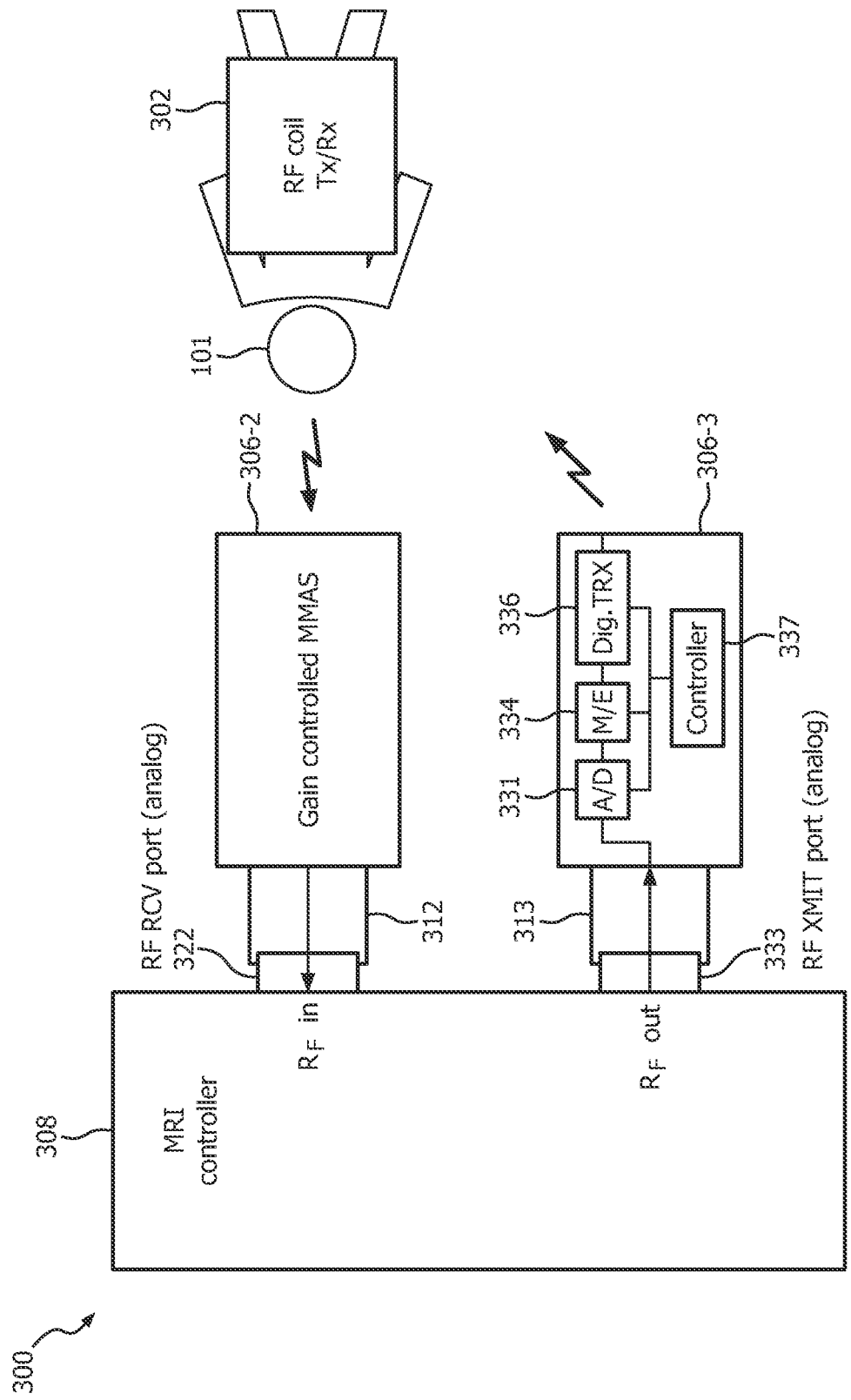
FIG. 3 shows a schematic block diagram of portion of an MRI system in accordance with embodiments of the present system.

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the appended claims. Moreover, for the purpose of clarity, detailed descriptions of well-known devices, circuits, tools, techniques, and methods are omitted so as not to obscure the description of the present system. It should be expressly understood that the drawings are included for illustrative purposes and do not represent the entire scope of the present system. In the accompanying drawings, like reference numbers in different drawings may designate similar elements. The term and/or and formatives thereof should be understood to mean that only one or more of the recited elements may need to be suitably present (e.g., only one recited element is present, two of the recited elements may be present, in any combination, etc., up to all of the recited elements may be present) in a system in accordance with the claims recitation and in accordance with one or more embodiments of the present system.

FIG. 1 shows an exploded partially cutaway schematic block diagram of a portion of an MR system 100 (hereinafter system 100 for the sake of clarity) in accordance with embodiments of the present system. The system 100 may include one or more of a MM controller 108, base stations (BSs) 106-1 and 106-2 (generally 106-x), a memory 107, user interface (UI) 160, an MM system assembly 114 (hereinafter MRI for simplicity), a main magnet 116, gradient coils 118, an RF transmit coil 105, an RF receive coil 102, and a patient support 170.

The patient support 170 may be provided to support an object-of-interest (OOI) for scanning such as a patient 101 (e.g., a human patient, an animal, a test subject etc.) and/or to position the OOI (hereinafter the patient 101 for the sake of clarity) in a desired position and/or orientation such as within a scanning volume (SV) 109 of the system 100 so that at least a portion of the patient 101 may be scanned. Accordingly, though the patient 102 is shown outside of the SV 109 for clarity, it should be understood that during operation of the system, the patient 102 would be positioned within the SV 109, such as by the patient support 170. The patient support 170 may be controllably positioned by the controller 108.

The controller 108 may control the overall operation of the system 100 in accordance with embodiments of the present system. The controller 108 may be coupled to an analog-type RF receive port 122 (hereinafter RF receive port) and an analog-type RF transmit port 133 (hereinafter RF transmit port). The controller 108 may receive multiple MRI analog signals from the RF receive port 122 coupled thereto and reconstruct an MRI image or a MR spectrograph as may be desired or otherwise configured. The controller 108 may transmit RF sequence signals from the RF transmit port 133. As may be readily appreciated, the controller 108 and portions thereof such as the UI 160 though shown as a portion of the MRI 114 for purposes of simplifying the discussion herein, could readily be otherwise located such as at a distance from the MR system 100, such as for example in another room. Such embodiments are explicitly included herein.

The MRI 114 may include an open- or closed-type MRI (e.g., corresponding with open-type or closed-type MRI systems, respectively). However, for the sake of simplicity, only a closed-type MRI (e.g., having the scanning volume located within a bore 103 of the main magnet 116) is discussed further herein though other embodiments should be understood to be within the scope of the present system.

The main magnet 116 may include one or more main magnets which may generate a main magnetic field (Bo) which may be substantially homogeneous within the scanning volume and may be controlled by the controller 108. As appreciated, the gradient coils 118 may generate gradient fields (e.g., gradient excitation pulses) along one or more axes (e.g., $G_x$, $G_y$, and $G_z$) under the control of the controller 108. These gradient fields may form at least part of an encoding sequence that may be applied to the patient.

The RF transmit coil 105 may be coupled to the RF transmit port 133 of the MRI (e.g., using an analog-type RF cable) and may receive the transmitted RF sequence signals from the controller 108 and may generate and emit corresponding RF fields (RF excitation pulses) under the control of the controller 108. These emitted RF fields may form at least part of the encoding sequence.

The encoding sequence may then be applied to the OOI (e.g., a portion of the patient) within the scanning volume (SV). In response to application of the encoding sequence (which may include the gradient and/or the RF excitation pulses), the OOI such as the patient 101 may emit magnetic resonance signals which may be received by a receiver of the RF receive coil 102 situated within or close to the SV so as to receive the emitted magnetic resonance signals. These resonance signals may then be processed, transmitted to the controller 108, and reconstructed into, for example, an MM image in accordance with embodiments of the present system.

For example, in accordance with embodiments of the present system the RF receive coil 102 may include one or more antenna loops which may receive the emitted magnetic resonance signals and provide these signals to a receiver for further processing. The receiver may then process the acquired emitted resonance signals and form a corresponding multiple MRI analog signal (MMAS). The receiver may include a plurality of channels, as designed, and may perform signal processing such as amplification upon the acquired emitted resonance signals prior to forming the corresponding MMAS. The MMAS may then be provided to the BS 106-1 for further processing and transmission as may be described below in accordance with embodiments of the present system.

The BS 106-1 may include one or more of a controller 135, an analog-to-digital (A/D) converter 131, a digital data merger/encoder (DDME) 134, and a digital transmitter/receiver (Digital TRX) 136. The controller 135 may be configured (e.g., programmed and/or otherwise structured) to control the overall operation of the BS 106-1 in accordance with embodiments of the present system. Although operation is illustratively described as under control of the controller 135 for purposes of describing a processing flow, in accordance with embodiments of the present system, the controller 135 may be partially or completely absent and the signal flow described herein may occur through the coupling of elements together as shown.

In accordance with embodiments wherein a controller, such as controller 135, 137, and/or processor is utilized, the processor may be operationally coupled to a memory such as a device for storing application data as well as other data related to the described operation. The application data and other data are received by the processor/controller for configuring (e.g., programming) the processor to perform operation acts (e.g., encoding, decoding, gain matching, etc.) in accordance with the present system. The processor so configured becomes a special purpose machine particularly suited for performing in accordance with embodiments of the present system.

The methods of the present system are particularly suited to be carried out by a computer software program, such program containing modules corresponding to one or more of the individual steps or acts described and/or envisioned by the present system. Such program may of course be embodied in a computer-readable medium, such as an integrated chip, a peripheral device or memory, or other memory coupled to the processor/controller.

In accordance with embodiments of the present system, the BS 106-1 may be coupled to the RF receive coil 102 using any suitable coupling including a direct connection there between. In accordance with embodiments of the present system, the BS 106-1 may be coupled to the RF receive coil 102 over one or more of a wired coupling, a wireless coupling and an optical coupling (e.g., coupling method), such as a wired, wireless (e.g., radio frequency (RF) transmitter, high frequency transmitter, etc.) and/or fiber optic coupling to the RF receive coil 302. To simplify the discussion herein, the term wireless and/or wireless transmitter and formatives thereof are utilized herein however should be understood to include one or more of a wireless and/or optical coupling, transmitter, etc., unless otherwise specified.

The BS 106-1 may include an RF input port 110 which may be coupled to an RF output port 103 of the RF receive coil 102 so as to receive signals output from the RF receive coil 102 such as the MMAS. These signals (e.g., the MMAS) may, after transmission and processing be reconstructed to form an MRI image and/or an MRS spectrograph by the MRI/MRS system, as described herein.

Referring back to the BS 106-1, once the BS 106-1 receives the MMAS, it may be input into the A/D converter 131 which may digitize the signal and a corresponding multiple MRI digital signal (MMDS) which is a digital signal that is based upon the MMAS. Then, the MMDS may be input to the DDME 134 for merging (e.g., compression), and/or encoding (e.g., encoding and/or error correction such as forward error correction and/or the like) and may be output as a digital data stream (DDS) signal. The DDS signal may then be input into the digital TRX 136 which may process the DDS signal for transmission to the BS 106-2 using a suitable transmission method (or methods) such as wireless and/or optical transmission methods. The transmission method or methods used may for example include digital data transfer methods such as encoding on a carrier frequency, handshaking signals there between, etc. Accordingly, transmission and/or reception methods of the TRXs 136 and 166 of the BS-2 may be in accord (e.g., matched) with each other. In accordance with embodiments of the present system, the DDS signal may be provided to the digital TRX 136 for transmission as a digitally-transmitted RF sequence using any suitable digital data transfer method or methods, such as uni-directional or bi-directional digital data transfer method or methods. In accordance with embodiments, the digital TRX for transmission may operate as a wireless and/or fiber optic coupling between the TRXs 136 and 166.

The BS 106-2 may include one or more of a controller 137, a digital-data-decoder 161, a digital-to-analog (D/A) converter 144, a digital transmitter/receiver (Digital TRX) 166, one or more filters 172, and a gain controller 174. The controller 137 may be configured (e.g., programmed and/or otherwise structured) to control the overall operation of the BS 106-2. Although operation is illustratively described as under control of the controller 137 for purposes of describing a processing flow, in accordance with embodiments of the present system, the controller 137 may be partially or completely absent and the signal flow described herein may occur through the coupling of elements together as shown.

At the BS 106-2, the digital TRX 166 may receive the transmitted DDS signal and process it back to a DDS signal (e.g., for example a reciprocal processes to that of the digital TRX 136), this DDS signal may then be forwarded to the digital data decoder 161 which may decode and/or decompress the received DDS signal so as to form an MMDS which is similar to the MMDS formed within the BS 106-1. The digital data decoder 161 may perform the decoding and/or decompression using decoding and/or decompression techniques that match the compression and/or decoding methods used by the digital merger/encoder 134. Once formed the MMDS may be provided to the D/A converter 144 for digital-to-analog conversion.

The D/A converter 144 may then convert the input MMDS signal to a corresponding MMAS which may correspond with the MMAS output by the RF receive coil 102 and which may be filtered by filters 172 (e.g., analog filters) for example to remove spurious signals and/or otherwise produce a filtered MMAS signal similar as produced by a legacy receive coil and cabling system. For example, the filters 172 may include analog bandpass filters, etc. as may be desired. Thereafter, the filtered MMAS may be input to the gain controller 174 which may control gain of the filtered MMAS.

In accordance with embodiments of the present system, the gain controller 174 may control the gain of the received filtered analog MMAS so that it is in accord with a desired gain value and/or range such as a gain control threshold value (GCTV) and/or gain control threshold range (GCTR). For simplicity, a gain control threshold (GCT) is discussed further herein although it should be understood to include one or more of a GCTV and GCTR. The gain controller 174 may include any suitable gain control circuit such as an analog amplifier and/or a analog gain controller. In accordance with embodiments of the present system, the gain of the received filtered analog MMAS may be controlled such that it may effectively match gain of the MMAS in the circumstance that it is provided by the RF receive coil 102 to the RF receive port 122 via conventional galvanic RF cables (e.g., coupled between the RF port 103 to the RF receive port 122 in a legacy MRI/MRS system). Accordingly, a gain of the filtered analog MMAS may be compared with GCT. The GCT may be determined mathematically and/or may be based upon actual (e.g., experimental) values obtained during actual testing using the conventional coil and RF cable combination in a legacy MRI/MRS system coupled as described herein.

In accordance with embodiments of the present system, variable gain may be introduced after the D/A converter for example by the gain controller 174 which may be configured to increase the dynamic range of the converted signal. Mill signals may typically operate within a dynamic range >18 bit of digital data. However, conventional D/A converters may not be able to achieve that range, even with oversampling. Therefore, in accordance with embodiments of the present system, the gain controller 174 may be configured to operate in one or more gain steps (e.g., one to ten discrete amplification stages connected in series, as may be practically employed to advantage) to meet the dynamic range requirements of the signal.

Although the gain controller 174 is illustratively shown following the D/A converter 144, in accordance with embodiments of the present system, the gain controller 174 may be positioned before the D/A converter 144 (e.g., the gain controller 174 may include one or more digital gain portions to receive the signal prior to the D/A converter 144) and/or after the D/A converter 144 (e.g., the gain controller 174 may include one or more analog and digital gain portions). Further gain control may be similarly provided by the base station 106-1 so that in accordance with embodiments of the present system, one or more portions of adjusting the gain (analog and/or digital gain) may be provided by one more portions of the base stations 106-x.

As readily appreciated, gain from a signal such as from the receive coil 102 may vary from scan to scan and even within a scan. In accordance with embodiments of the present system, all digital and/or analog gains may be calibrated such, that the overall gain (e.g., a combination of all effective gains) may be substantially constant over a scan (e.g., over the entire scan or some portion thereof). In this way, in accordance with embodiments of the present system, the system controller (e.g., the controller 108) may reconstruct an image utilizing linear data or at least substantially linear data (e.g., data that does not vary more than plus or minus 20%, 10%, 5% or 1% as desired and required by the MRI for reconstruction).

In accordance with embodiments of the present system, these gain stages may or may not include analog and/or digital gain stages in the MRI itself (e.g., after the RF receive port 122 but before the controller 108), provided that there is coordination (e.g., a software linkage) between the base station and the MRI (e.g., the system receiver, controller, etc.) so that these gain stages may be suitably aligned and/or otherwise coordinated for operation.

In accordance with embodiments of the present system, the gain controller 174 may include a gain controller that determines an actual gain by employing a running average of the filtered MMAS and may compare this value to the GCTV. Accordingly, when it is determined that the actual gain of the filtered MMAS is greater than the GCTV, the process may lower the gain of the filtered MMAS (e.g., decreasing amplification of the filtered MMAS) to form a gain-controlled MMAS. However, when it is determined that the actual gain of the filtered MMAS is less than the GCTV, the process may increase the gain (e.g., by increasing the amplification of the filtered MMAS) to form a gain-controlled MMAS. Lastly when it is determined that the actual gain of the filtered MMAS is equal to or substantially equal to the GCTV, the process may be operative to maintain the current gain (e.g., not adjust a current amplification). The gain-controlled MMAS may then be provided to the MRI controller 108 via the coupler 112 and the RF receive port 122 for further processing by the Mill controller 108 such as for reconstruction of an MRI image and/or a spectrograph and/or rendering on a display such as a display 162 of the UI 160. The controller 108 may then store the reconstructed information in a memory of the system such as the memory 107 for later use.

Referring back to the BSs 106-x, these BSs may include a plurality of channels which may perform the above-described acts (e.g., A/D conversion, merger/encoding, transmission, reception, decoding/decompression, D/A conversion, filtering, and/or gain control) for each channel in parallel and/or in series, as may be desired. With regard to processing time and delays, it will be appreciated that any processing delays should be minimized so that system performance is not adversely affected. For example, in accordance with embodiments of the present system, the delay introduced to the signal from the coil 102 to the RF receive port 122 may be minimized to ensure that the signal provided to the RF receive port 122 arrives within a capture window of a signal in the legacy MRI/MRS system to be processed accordingly as described.

FIG. 2 shows an exploded partially cutaway schematic block diagram of portion of an MR system 200 in accordance with embodiments of the present system. The MR system 200 may be similar to the MR system 100 and similar numerals may be used to denote similar portions. However, rather than using the RF receive coil 102 and a base station (e.g., BS-1) attached thereto, a wireless-type RF receive coil 202 is provided. The wireless-type RF coil 202 may receive emitted magnetic resonance signals from the patient similarly to the RF receive coil 102. However, in accordance with embodiments of the present system, the wireless-type RF coil 202 may internally process the received signals (e.g., analog to digital conversion, encoding, etc.) and transmit a DDS similarly to operations performed by the BS 102-1. The BS 102-2 may then receive the transmitted DDS and process it similarly as described with reference to the base station 102-2 of FIG. 1. Accordingly, the BS 102-2 may receive the transmitted DDS, process it to decode and/or decompress it so as to form an MMDS. In accordance with embodiments of the present system, the MMDS may then be filtered and/or gain controlled to form a gain-controlled MMAS which may then be provided to the RF receive port 122 as discussed with reference to FIG. 1.

FIG. 3 shows a schematic block diagram of portion of an MRI system 300 in accordance with embodiments of the present system. The MR system 300 may be similar to the MR systems 100, 200 and may include an MRI controller 308, a wireless-type RF coil 302, a first BS 306-1 and a second BS 306-2. The MRI controller 308 and the second BS 306-2 may operate similarly to the BSs 108 and 208 and the second BSs 106-2 and 206-2. However, a third-type of base station (e.g., BS 306-3) may be provided.

The BS 306-3 may include one or more of a controller 337, an analog-to-digital (A/D) converter 331, a merger/encoder (M/E) 334, a digital transmitter/receiver (digital TRX) 336, and an analog-type RF input port 313. In accordance with embodiments of the present system, the controller 337 may control the overall operation of the BS 306-3.

The analog-type RF input port 313 may be coupled to an analog-type RF transmit port 333 (hereinafter RF transmit port) which may be similar to the RF transmit port 133 of FIG. 1. Generally, the MRI controller 308 may generate analog-type RF sequence signals for the RF coil 302 and output them (e.g., the analog-type RF sequence signals) at the RF transmit port 133.

The BS 306-3 may receive these transmitted analog-type RF sequence signals from the controller 308 and process them to, for example, perform an analog-to-digital (A/D)

conversion in the A/D 331 to digitize the RF sequence signals. Then, these digitized RF sequence signals may be merged and/or encoded by the merger/encoder 334 and may be output as encoded and/or merged RF sequence signals. These encoded and/or merged RF sequence signals may be provided to the digital TRX 336 for transmission as a digitally-transmitted RF sequence using any suitable digital data transfer method or methods, such uni-directional or bi-directional digital data transfer method or methods. For example, in accordance with embodiments of the present system, the digital data transfer method may utilize a wireless communication method and/or an optical communication method, such as a wireless and/or fiber optic coupling to the RF coil 302.

In accordance with these embodiments of the present system, the RF coil 302 may be transmit/receive (Tx/Rx) coil type which may include an on-board power supply to generate power to be used by the RF coil. The RF coil may receive the digitally-transmitted RF sequence, may process it and may generate and emit corresponding RF fields (RF excitation pulses) at the patient 101 under the control of the controller 108. These emitted RF fields may form at least part of the encoding sequence. The RF coil 302 may then receive emitted magnetic resonance signals from the patient 101 similarly to the RF receive coils 102 and 202. However, the RF coil may internally process the received signals and transmit a DDS similarly to operations performed by the BS 106-1 and the RF receive coil 202 (or FIGS. 1 and 2). The BS 306-2 may then receive the transmitted DDS and process it similarly to the BS 106-2 of FIG. 1 and the BS 206-2 of FIG. 2 and provide a gain-controlled MMAS to the controller 308. As this processing is described elsewhere, a further description thereof will not be provided for the sake of clarity.

The BS 306-2 may be coupled to the MRI controller 308 via an analog-type RF output port 312 of the BS 306-2 and an analog-type RF receive port 322 of the MRI controller 308.

Figure 4:
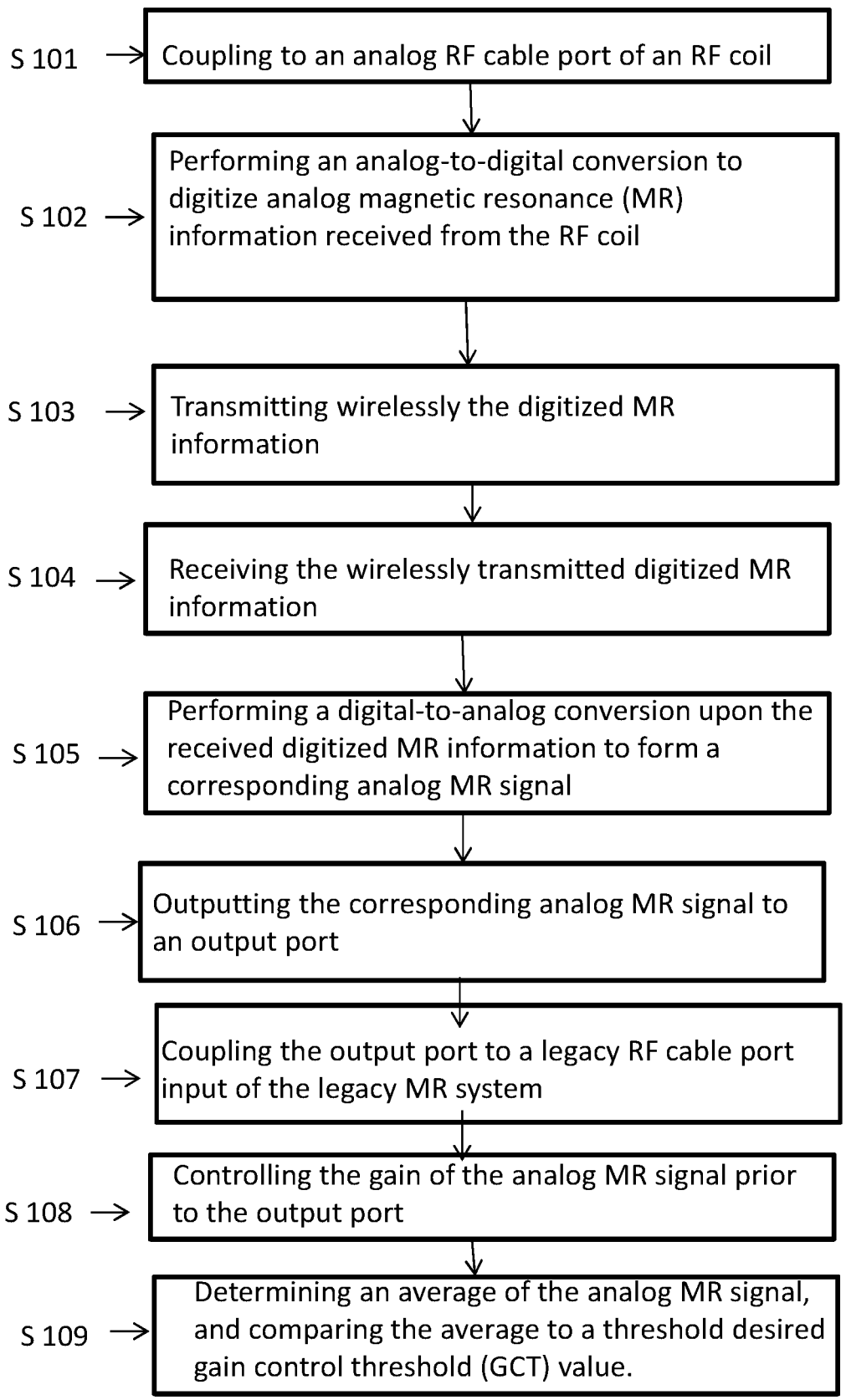
FIG. 4 shows an exemplary method in accordance with embodiments of the present system.

FIG. 4 is a flow-chart of a method 400 in accordance with a representative embodiment. As noted above, the method 400 may be carried out by a computer software program, such as a program containing modules corresponding to one or more of the individual steps or acts described and/or envisioned by the present system. Such a program may of course be embodied in a computer-readable medium, such as an integrated chip, a peripheral device or memory, or other memory coupled to the processor/controller. The computer-readable storage medium may be referred to as a non-transitory computer-readable storage medium, to distinguish from transitory media such as transitory propagating signals. The computer-readable storage medium may also be referred to as a tangible computer-readable medium. The program includes instructions that, when executed by the processor/controller, cause the processor/controller to perform the method 400.

At S 101, the method comprises Coupling to an analog RF cable port of an RF coil At S 102, the method comprises performing an analog-to-digital conversion to digitize analog magnetic resonance (MR) information received from the RF coil At S 103, the method comprises transmitting wirelessly the digitized MR information.

At S 104, the method comprises, the method comprises receiving the wirelessly transmitted digitized MR information.

At S 105, the method comprises performing a digital-to-analog conversion upon the received digitized MR information to form a corresponding analog MR signal.

At S 106, the method comprises outputting the corresponding analog MR signal to an output port; and At S 107, the method comprises coupling the output port to a legacy RF cable port input of the legacy MR system.

At S 108, the method comprises controlling the gain of the analog MR signal prior to the output port.

At S 109, the method comprises determining an average of the analog MR signal, and comparing the average to a threshold desired gain control threshold (GCT) value.

As described, embodiments of the present system may provide a first base station located in proximity to an RF coil. The RF coil may generate signals which may include information emitted by a patient in response to a transmitted RF sequence (e.g., in analog form). In accordance with embodiment, the first base station may obtain these signals, digitize them and thereafter, modulate them onto a wireless carrier using any suitable digital encoding scheme.

Suitable digital encoding schemes may include, for example, reversible data compression schemes and/or forward error correction schemes which may form a digitally-encoded signal, such as a wireless signal, optical signal, etc. In accordance with embodiments, the digitally-encoded wireless signal data stream may be streamed to a partner radio receiver such as a second base station. After reception of the digitally-encoded wireless signal as a data stream signal, the second base station may decode, decompress the signal to obtain digitized echo information. Then, using a digital-to-analog (D/A) converter, the digitized echo information may be converted to analog echo information. The analog echo information may be filtered using a suitable filter such as an analog filter or filters to remove spurious signals, etc. The filtered signal may then be provided to a gain stage for gain adjustment and may be output as gain-adjusted analog echo information.

As described, the gain-adjusted analog echo information may then be introduced to an analog-type MRI/MRS system via an analog-type RF input port. The gain adjustment may be performed such that parameters of the gain-adjusted echo information signal may be in accord (e.g., substantially match, such as within an acceptable range of amplitude) with an amplitude level of an analog signal that may be introduced into the analog port using conventional wired coupling methods using standard RF cables which couple the RF coil to the MRI system. In accordance with embodiments of the present system, transport delays may be minimized and/or substantially eliminated, so that a system architecture of the analog-type MRI system may compensate for any transport delays.

Accordingly, embodiments of the present system may provide a wireless retrofit for conventional wired RF coils such as analog-type RF receive coils which receive analog echo from an OOI to be transmitted and reconstructed remote from the RF coil. By using wireless communication methods to transmit the digitized data in accordance with embodiments of the present system, the use of galvanic conductors such as RF cables may be avoided. Further, by providing an RF receive coil that is separate from the legacy Mill/MRS system, the receive coil may be provided that is particularly suited for a given application. For example, in accordance with an embodiments of the present system, the coil 102/202/303 may be formed, shaped, etc., to be particularly suited for receiving signals emitted by particular system assembly portions. For example, the coil may be shaped in a form of a shoulder to better receive the signals from the OOI. As may be readily appreciated, other shapes (such as suited for a knee, etc.) may be suitably used when such imaging is desired. In this way, rather than being required to utilize one coil for all types of imaging, coils may be provided that are particularly suited for a given imaging application.

Accordingly, embodiments of the present system may provide an upgrade for legacy analog-type MRI and MRS systems which may provide for the compatibility with legacy systems yet obviate the use of galvanic cables for interconnection to the coil such as the RF receive coil as described. Accordingly, as one or more galvanic cables may be obviated, SAR, due to RF emissions from the galvanic cables, may be reduced. Moreover, signal losses associated with long runs of the galvanic cables may be prevented which can result in improved image quality. Further, as an RF receive portion operating in accordance with embodiments of the present system may be a wireless stand-alone unit, suitability, aesthetics and handling of the RF receive portion for given imaging applications may be improved.

Finally, the above-discussion is intended to be merely illustrative of the present system and should not be construed as limiting the appended claims to any particular embodiment or group of embodiments. Thus, while the present system has been described with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise;

h) each of these disclosed devices, portions thereof and/or combinations thereof should be understood to be a separate embodiment that is operable separately from any other embodiments and/or combinations thereof;

i) no specific sequence of acts or steps is intended to be required unless specifically indicated;

j) the term "plurality of" an element includes two or more of the claimed element, and does not imply any particular range of number of elements; that is, a plurality of elements may be as few as two elements, and may include an immeasurable number of elements; and k) the term and/or and formatives thereof should be understood to mean that only one or more of the listed elements may need to be suitably present in the system in accordance with the claims recitation and in accordance with one or more embodiments of the present system.

The invention claimed is:

1. A transmission apparatus for a legacy magnetic resonance (MR) system, comprising:
a radio-frequency (RF) transmission portion having a coupler for coupling to an analog radio frequency (RF) cable port of an RF coil, the RF transmission portion comprising at least one first controller, an analog-to-digital converter (A/D), and a first digital transceiver, the first controller being configured to control the A/D to digitize analog magnetic resonance (MR) information received from the RF coil and to control the first digital transceiver to transmit the digitized MR information; and
a radio-frequency (RF) reception portion having an analog output port and a coupler for coupling the analog output port to a legacy RF cable port input of the legacy MR system, the RF reception portion comprising: at least one second controller; a second digital transceiver; a digital-to-analog converter (D/A), the at least one second controller being operative to control the second digital transceiver to receive the transmitted digitized MR information, and to control the D/A to perform a digital-to-analog conversion upon received digitized MR information to form a corresponding analog MR signal which is output at the analog output port; and a gain controller operative to control the gain of the analog MR signal prior to the output,
wherein: the first digital transceiver and the second digital transceiver communicate with each other using a bi-directional digital data transfer method; and the gain controller determines an average of the analog MR signal, and compares the average to a threshold desired gain control threshold (GCT) value.

2. The transmission apparatus of claim 1, wherein the gain controller adjusts the gain of the analog MR signal based upon results of the comparison.

3. The transmission apparatus of claim 1, further comprising at least one of a wireless or optical transmitter, to perform the transmission of the digitized MR information.

4. The transmission apparatus of claim 1, wherein the RF reception portion further comprises analog filters which filter the analog MR signal prior to the gain control.

5. The transmission apparatus of claim 1, wherein the digital data transfer method includes at least one selected from the group of encoding on a carrier frequency and a handshaking signals.

6. A transmission apparatus for a legacy magnetic resonance (MR) system, comprising:
a transmit-type radio frequency (RF) coil comprising a plurality of receive-loops for receiving induced MR signals from an object-of-interest (OOI) subject to MR sequence signals, and at least one first controller, the at least one first controller configured to form MR information based upon the received induced MR signals, digitize the MR information, and to transmit the MR information as a digital data stream signal with a first digital transceiver; and
a radio-frequency (RF) reception portion having an analog output port and a coupler for coupling the analog output port to a legacy RF cable port input of the legacy MR system, the RF reception portion comprising: at least one second controller; a second digital transceiver; a digital-to-analog converter (D/A), the at least one second controller operative to control the second digital transceiver to receive the transmitted digitized MR information, and control the D/A to perform a digital-to-analog conversion upon received digitized MR information to form a corresponding analog MR signal which is output at the analog output port; and a gain controller operative to control the gain of the analog MR signal prior to the output, wherein: the first digital transceiver and the second digital transceiver are bi-directional transceivers that communicate with each other using a digital data transfer method; and the gain controller determines an average of the analog MR signal, and compares the average to a threshold desired gain control threshold (GCT) value.

7. The transmission apparatus of claim 6, wherein the gain controller adjusts the gain of the analog MR signal based upon results of the comparison.

8. The transmission apparatus of claim 6, further comprising at least one of a wireless or optical transmitter, to perform the transmission of the digitized MR information.

9. The transmission apparatus of claim 6, wherein the RF reception portion further comprises analog filters which filter the analog MR signal prior to the gain control.

10. The transmission apparatus of claim 6, further comprising a wireless-type RF coil adapted to receive emitted MR signals.

11. A method for upgrading a legacy MR system, the method comprising:

coupling to an analog RF cable port of an RF coil;

performing an analog-to-digital conversion to digitize analog magnetic resonance (MR) information received from the RF coil;

transmitting wirelessly the digitized MR information with a first digital transceiver;

receiving the wirelessly transmitted digitized MR information with a second digital transceiver, wherein the first digital transceiver and the second digital transceiver are bi-directional transceivers that communicate with each other using a digital data transfer method;

performing a digital-to-analog conversion upon the received digitized MR information to form a corresponding analog MR signal; and outputting the corresponding analog MR signal to an output port;

coupling the output port to a legacy RF cable port input of the legacy MR system;

controlling gain of the analog MR signal prior to the output port; and determining an average of the analog MR signal, and comparing the average to a threshold desired gain control threshold (GCT) value.

12. The method of claim 11, comprising an act of adjusting the gain of the analog MR signal based upon results of the comparison.

13. The method of claim 11, comprising an act of filtering the analog MR signal prior to the gain control.

14. The method of claim 11, wherein the digital data transfer method includes at least one selected from the group of encoding on a carrier frequency and a handshaking signals.

15. A non-transitory tangible computer-readable storage medium, comprising instructions which, when executed by a processor, cause the processor to perform the method of claim 11.

* * * * *